United States Patent
Heragu et al.

(10) Patent No.: US 7,216,247 B2
(45) Date of Patent: May 8, 2007

(54) METHODS AND SYSTEMS TO REDUCE DATA SKEW IN FIFOS

(75) Inventors: Keerthinarayan P. Heragu, Richardson, TX (US); Patrick Bosshart, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 457 days.

(21) Appl. No.: 10/912,397

(22) Filed: Aug. 5, 2004

(65) Prior Publication Data

US 2006/0031703 A1    Feb. 9, 2006

(51) Int. Cl.
*H03L 7/06* (2006.01)
(52) U.S. Cl. ............ 713/401; 713/400; 713/500; 713/501; 713/502; 713/503; 713/600; 713/601
(58) Field of Classification Search ........ 713/400–401, 713/500–503, 600–601
See application file for complete search history.

(56) References Cited

U.S. PATENT DOCUMENTS

| | | | | |
|---|---|---|---|---|
| 5,861,764 A | * | 1/1999 | Singer et al. ............ | 326/93 |
| 6,114,890 A | * | 9/2000 | Okajima et al. .......... | 327/170 |
| 6,530,006 B1 | * | 3/2003 | Dodd et al. ............. | 711/167 |
| 6,891,415 B2 | * | 5/2005 | Mikhalev et al. ........ | 327/158 |
| 6,920,576 B2 | * | 7/2005 | Ehmann ................ | 713/400 |
| 7,116,599 B1 | * | 10/2006 | Au et al. ................ | 365/221 |
| 7,143,275 B2 | * | 11/2006 | Cepulis et al. .......... | 713/1 |

* cited by examiner

*Primary Examiner*—A. Elamin
(74) *Attorney, Agent, or Firm*—W. James Brady, III; Frederick J. Telecky, Jr.

(57) ABSTRACT

The disclosed invention provides methods and systems for writing and reading data in systems using multiple FIFO buffer elements. For each buffer element, a determination is made of when the rising edge of the read clock occurs during the second half of the write clock cycle. Responsive to this determination, the data written into the FIFO buffer element is shifted in order to reduce skew.

11 Claims, 3 Drawing Sheets

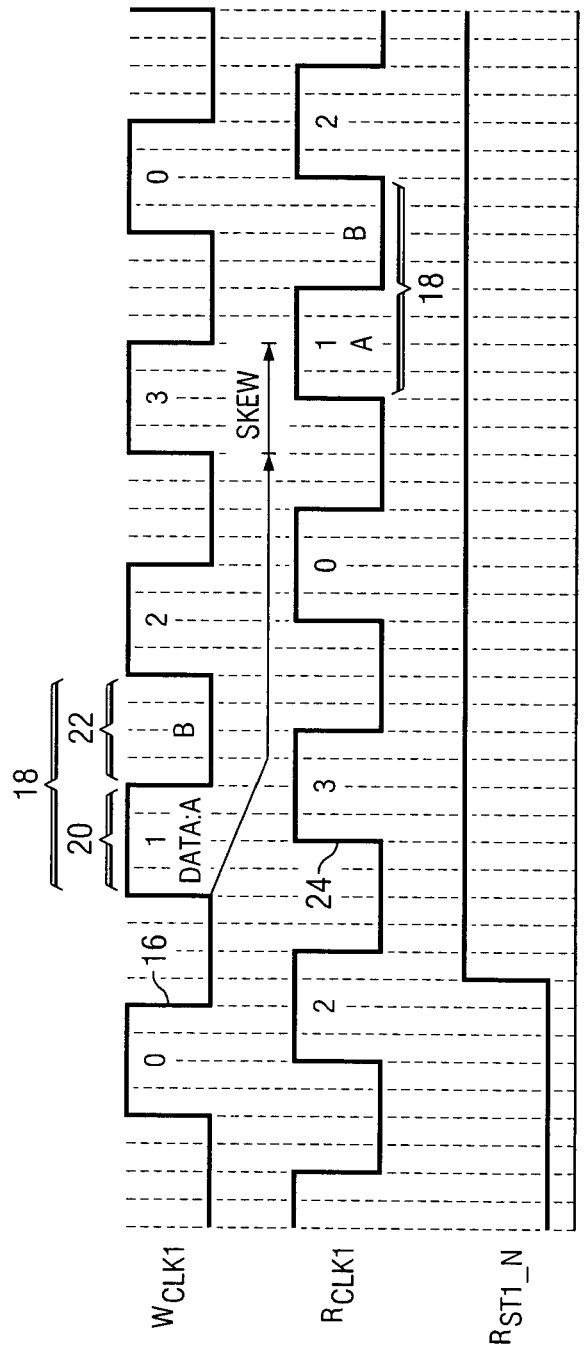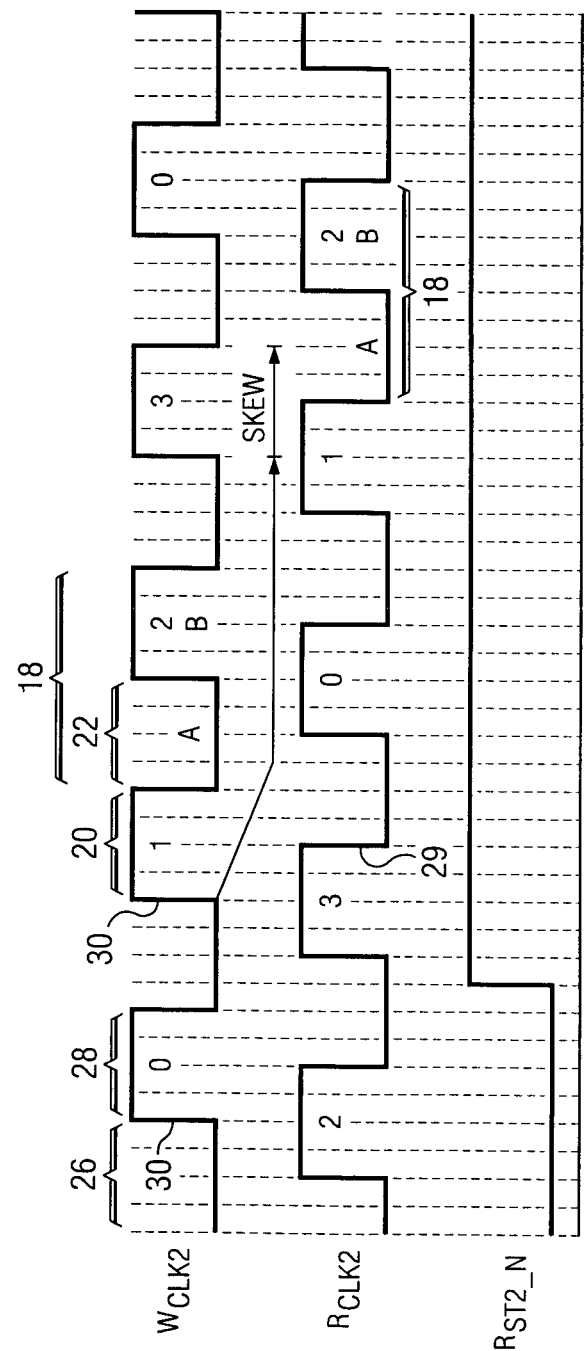

METHODS AND SYSTEMS TO REDUCE DATA SKEW IN FIFOS

TECHNICAL FIELD

The invention relates in general to signal processing and mixed signal logic circuitry and methods. More particularly, it relates to methods and systems for reducing data skew in applications having asynchronous first-in-first-out (FIFO) buffers using two or more clock signals with the same frequency but an unknown phase relationship.

BACKGROUND OF THE INVENTION

Multiple asynchronous first-in-first-out (FIFO) buffers are sometimes used in applications where it is desired to use data from domains that operate on two clocks that have the same frequency but, have an unknown phase relationship. For each buffer, one of the clocks, called the write clock, is used to write into the FIFO buffer element, and the other clock, called the read clock, is used to read the data from the buffer element. In such an arrangement, write and read operations are necessarily separated in time in order to accommodate the potential phase differences of the two clocks. In systems using multiple FIFO buffer elements, the write clocks and the data to be written may be aligned, but the read clocks may be of arbitrary phase. Accordingly, when more than one buffer element is used in a system, delay due to the potential time differential, also called skew, can result. Data skew is defined herein for the purposes of illustrating the invention as the maximum possible time difference between the time data is read out of the first FIFO element and the time data is read out of the second FIFO element. Skew causes a system to perform more slowly, resulting in decreased throughput and ultimately in higher costs.

Due to these and other problems, improved systems and methods for reading and writing data with reduced skew in systems using multiple FIFO buffer elements would be useful and desirable in the arts.

SUMMARY OF THE INVENTION

In carrying out the principles of the present invention, in accordance with preferred embodiments thereof, methods and systems are provided in which data skew may be reduced in systems using multiple FIFO buffers.

According to one aspect of the invention, methods are implemented for writing and reading data in systems having multiple FIFO buffers. Each buffer of the system is provided with a write clock signal and a read clock signal having the same frequency, but independent of phase. Steps of the invention include providing an inverted write clock signal for each write clock signal, and sampling each buffer's read clock signal using its write clock signal and its inverted write clock signal. Using the samples, it is determined whether the rising edge of the read clock signal coincides with the first half or second half of the write clock signal. Upon making a determination that the leading edge of the read clock signal coincides with the second half of the write clock signal, data written to the buffer is delayed for one half of a write clock cycle.

According to another aspect of the invention, the methods of the invention include steps for providing a delayed write clock signal for each buffer and for sampling the read clock signal using the delayed write clock signal. The sampled read clock signal is used in determining whether the rising edge of the read clock signal coincides with the first half or second half of the write clock signal.

According to additional aspects of the invention, systems are provided for passing data through a plurality of asynchronous FIFO buffer elements. The system includes means for providing each buffer with a write clock signal, a read clock signal, and means for writing data to each buffer. The system also includes means for determining whether the rising edge of the read clock signal coincides with the second half of the write clock signal, and means for responsively delaying for one half of a write clock cycle, and subsequently writing data to the buffer. The system also includes means for reading data from each buffer.

According to still another aspect of the invention, systems according to the invention include means for providing each buffer with an inverted write clock signal and a delayed write clock signal. Means for determining whether the rising edge of the read clock signal coincides with the second half of the write clock signal further include means for providing each buffer with a write clock signal delayed by one quarter of a cycle. Sampling means are used to make a determination of when the rising edge of the read clock cycle coincides with the second half of the write clock cycle whereby skew is reduced by shifting the data written to the buffer element.

The invention provides technical advantages including but not limited to reduction of skew, leading to further advantages in terms of time and cost savings. These and other features, advantages, and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which:

FIG. 2 is a timing diagram depicting an example of associated write clock, read clock, and reset signals illustrative of the invention in a scenario where the leading edge of the read clock cycle coincides with the first half of the write clock cycle;

FIG. 3 is a timing diagram depicting an example of associated write clock, read clock, and reset signals illustrative of the invention in a scenario where the leading edge of the read clock cycle coincides with the second half of the write clock cycle;

References in the detailed description correspond to like references in the figures unless otherwise noted. Descriptive and directional terms used in the written description such as first, second, top, bottom, upper, side, etc., refer to the drawings themselves as laid out on the paper and not to physical limitations of the invention unless specifically noted. The drawings are not to scale, and some features of embodiments shown and discussed are simplified or amplified for illustrating the principles, features, and advantages of the invention.

DETAILED DESCRIPTION OF PREFERRED EMBODIMENTS

In general, the invention provides methods and systems for writing and reading data in systems wherein it is desired to pass data through multiple FIFO buffer elements. For each buffer element, a determination is made of whether the rising edge of the read clock occurs during the first half or the second half of the write clock cycle. Based upon this determination, the data written into the FIFO buffer element may be shifted in order to reduce skew.

For the purposes of providing context for disclosing and describing the invention, an electronic data system is assumed. It is further assumed that the system is stable in general and that there are no metastability issues in particular. Those skilled in the arts should appreciate that the metastability issues that may arise may be addressed without affecting the practice of the invention. Of course, there are numerous applications where the invention may be useful and many variations are possible in its implementation. Although for the purposes of example, systems are described herein using two FIFO buffer elements, the invention may, and it is anticipated generally will, be used with more numerous buffer elements. In principle, the invention may be used with an infinite number of buffer elements, and is limited only by the physical aspects selected for the particular application at hand.

Figure 1:
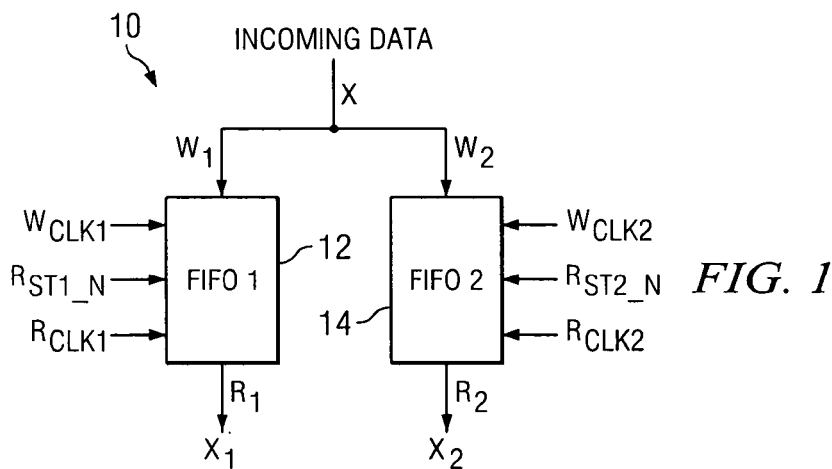
FIG. 1 is a simplified block diagram providing a conceptual overview of an example of a system using a preferred embodiment of the invention.

Referring to the drawings, examples of timing diagrams for a system 10 using the invention are shown for purposes of illustration. An overview of a system 10 implementing the invention is shown in FIG. 1. A first FIFO buffer element 12 and a second FIFO buffer element 14 are considered. In this example, the FIFO buffer elements 12, 14, each have a capacity to accommodate the storage of four two-bit words. Other FIFO buffer configurations may also be used without departure from the invention.

Clock signals are used to regulate the flow of data in writing to and reading from the buffer elements 12, 14 as is familiar in the arts. The write clocks are denoted by $W_{CLK1}$ and $W_{CLK2}$ for the first and second FIFO element 12, 14, write clocks respectively. The first and second read clock signals are denominated by $R_{CLK1}$ and $R_{CLK2}$. A reset signal, in this case inverted to reset the buffer element when "high," is indicated in each instance by $RST_{1\_N}$ and $RST_{2\_N}$. In the examples shown and described herein, the write clock $W_{CLKn}$ and read clock $R_{CLKn}$ pointers are separated by two words upon activation by their respective reset signals $RST_{N\_N}$.

Now referring primarily to FIG. 2, an example of the waveforms used for a first FIFO buffer 12 is shown for a scenario using a reset signal $RST_{1\_N}$ that is synchronized to occur on the falling edge 16 of the first write clock signal $W_{CLK1}$. Subsequent to this reset signal $RST_{1\_N}$, the first word of data, indicated by AB, is written into the FIFO element 12 at a particular address location 18. For the purpose of considering latency in this illustrative example, it may be assumed that data bit A is written in the first half of the write cycle 20 and that data bit B is written in the second half 22 of the cycle. By examination of the data bits, e.g., A or B, it can be perceived that the latency between the time when a data bit is written and when it is read, as indicated by the corresponding address location, e.g. 18, indicated on the read clock signal $R_{CLK1}$, is between four, and four and one-half cycles. The one-half cycle potential variation is present by virtue of the fact that the rising edge 24 of the read clock cycle $R_{CLK1}$ can occur at any point during the first half 20 of the write clock signal $W_{CLK1}$.

Now referring primarily to FIG. 3, a second scenario may be examined for a second FIFO buffer element 14, wherein the leading edge 29 of the read clock signal $R_{CLK2}$ occurs during the second half 22 of the write clock signal $W_{CLK2}$. In this example, a reset signal $RST_{2\_N}$ is synchronized to coincide with the rising edge 30, during the first half of the cycle of the write clock signal $W_{CLK2}$. In this scenario, the data written into the second FIFO element 14 is delayed, preferably by one-half cycle, using techniques known in the arts. Further examination of the waveforms shown in the example of FIG. 3 reveals that the latency between when a data bit, e.g., A or B, is written into the FIFO element 14 at a particular address location, e.g. 18, and when it is read out of the FIFO element 14, is again between four, and four and one-half cycles.

Thus, as shown by the example of these two scenarios, by bounding the variation in the latency of the data passed through the first and second FIFO elements 12, 14, the skew is limited to one-half cycle. In this way, data skew in a system using the invention may be advantageously reduced. There are many variations of circuits which may be used for implementing the invention. Essentially, using the invention, a determination is made of whether the rising edge 24 of the read clock signal $R_{CLKn}$ coincides with the first half 20 or the second half 22 of the write clock signal $W_{CLKn}$. This determination is used for implementing a shift in the writing of data when the read clock signal coincides with the second half 22 of the write clock signal $W_{CLKn}$ in order to reduce skew.

Figure 4A:
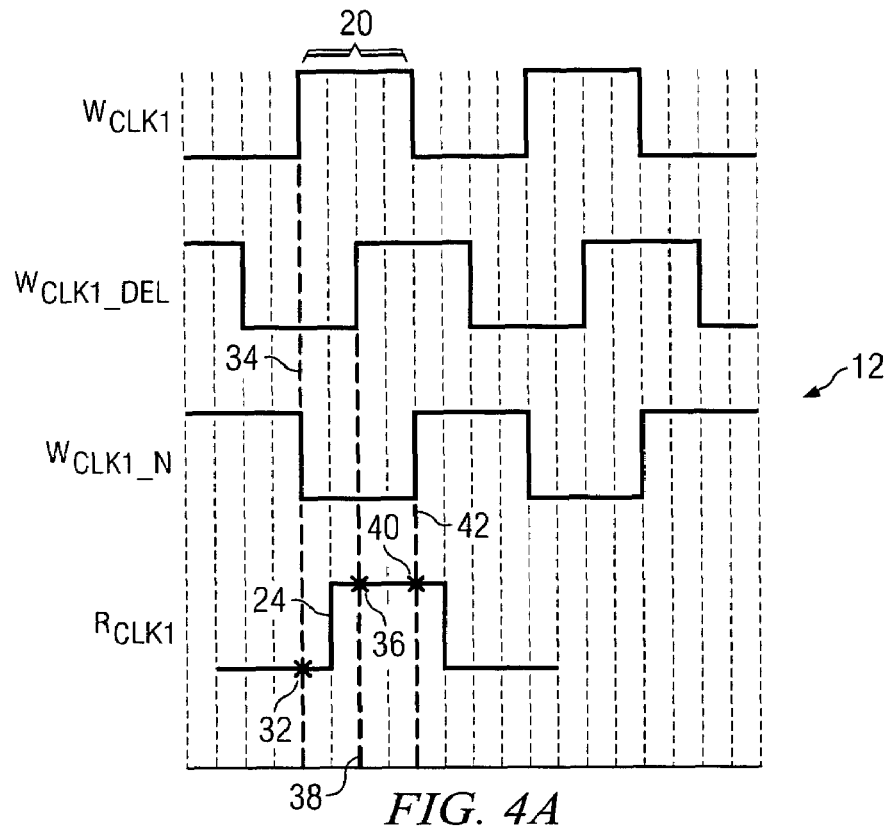
FIG. 4A is a timing diagram illustrating the operation of a preferred embodiment of the invention in a scenario where it is detected that the read clock cycles coincides with the first half of the write clock cycle.
Figure 4B:
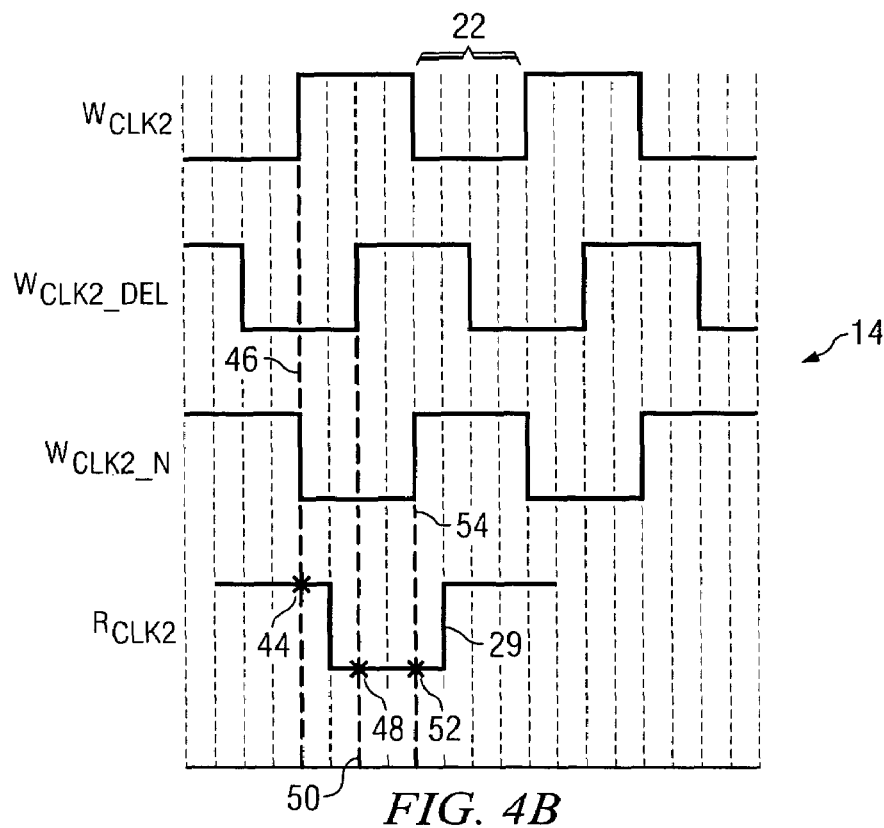
FIG. 4B is a timing diagram illustrating the operation of a preferred embodiment of the invention in a scenario where it is detected that the read clock cycles coincides with the second half of the write clock cycle.

Views showing timing diagrams to illustrate the implementation of methods according to the invention are provided in FIGS. 4A and 4B. In order to determine whether to shift the data upon writing into a FIFO element, a determination is first made of whether the rising edge of the read clock signal $R_{CLKn}$ coincides with the first or second half of the write clock signal $W_{CLKn}$. The write clock signal $W_{CLKn}$ is used along with the complement of the write clock signal $W_{CLKn\_N}$ to sample the read clock signal $R_{CLKn}$. Preferably, to reduce the probability of error due to flip-fop metastability problems when the data transitions in the setup-hold window, a third timing signal $W_{CLKn\_DEL}$ is also used to sample the read clock signal $R_{CLKn}$. Preferably, the third timing signal $W_{CLKn\_DEL}$ is a version of the write clock signal $W_{CLKn}$ delayed by one-quarter of a cycle.

By examination of FIG. 4A, with respect to the first read clock signal $R_{CLK1}$, it may be seen that the sample 32 corresponding to the write clock signal $W_{CLK1}$, as indicated by dashed line 34, is low. The sample 36 of the read clock signal $R_{CLK1}$ corresponding with the delayed write clock signal $W_{CLK1\_DEL}$, as indicated by dashed line 38, is high. The sample 40 of the read clock signal $R_{CLK1}$ corresponding with the complement of the write clock signal $W_{CLK1\_N}$, as indicated by dashed line 42, is also high. A summary of the possible outcomes from sampling the read clock signal of a FIFO element as described is displayed in Table 1. As may be seen, the outcome in this instance indicates that the rising edge 24 of the read clock signal $R_{CLK1}$ occurs during the first half 20 of the write clock cycle $W_{CLK1}$.

By comparison, examining FIG. 4B with respect to the second read clock signal $R_{CLK2}$, it may be seen that in this instance the read clock signal $R_{CLK2}$ sample 44 corresponding with the write clock signal $W_{CLK2}$, as indicated by dashed line 46, is high. The sample 48 of the read clock signal $R_{CLK2}$ corresponding with the delayed write clock signal $W_{CLK2\_DEL}$, as indicated by dashed line 50, is low. The sample 52 of the read clock signal $R_{CLK2}$ corresponding with the complement of the write clock signal $W_{CLK2\_N}$, as indicated by dashed line 54, is also low. In this instance, the occurrence of the read clock signal $R_{CLK2}$ during the second half 22 of the write clock signal $W_{CLK2}$ cycle is indicated. According to the invention, the data written into the second FIFO element 14 in this example is delayed by one-half cycle using techniques known in the arts.

Figure 5:
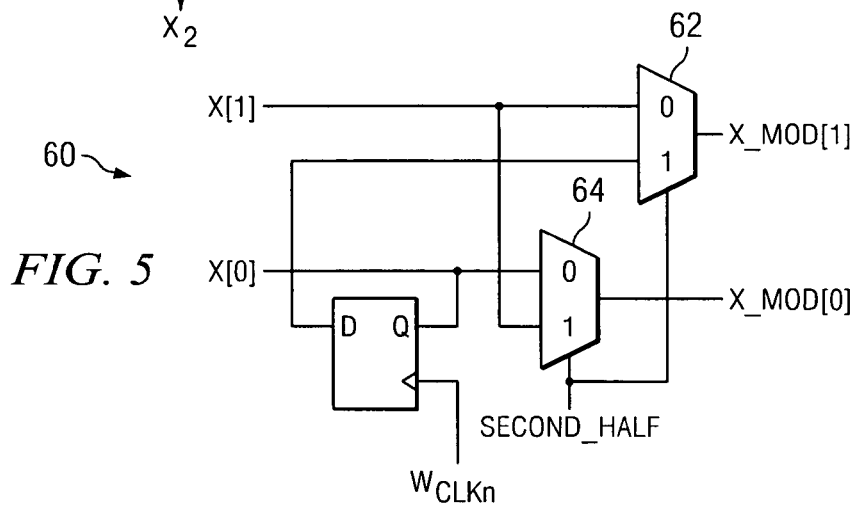
FIG. 5 is a schematic diagram showing an example of a circuit in a preferred embodiment for shifting the writing of data according to the invention.

An example of a circuit for implementing the shift in writing data to the buffer element by one-half cycle is shown in FIG. 5. This is merely one of many possible examples. Of course, many variations of alternative circuitry known in the arts are possible and may be used without departure from the invention as long as the input data bit X is appropriately delayed upon a determination that the rising edge of the read clock signal $R_{CLKn}$ occurs during the second half of the cycle of the write clock signal $W_{CLKn}$. By examination of the example circuit 60 of FIG. 5, it may be verified that a determination, indicated by SECOND_HALF, that the rising edge of the read clock signal $R_{CLKn}$ occurs during the second half of the write clock signal $W_{CLKn}$ is used to activate the multiplexers 62, 64. As a result, the input data bit X is delayed so that the output bit $X_{MOD}$ becomes aligned with the second half of the write clock signal $W_{CLKn}$. In instances where the data bit X does not coincide with SECOND_HALF, the output $X_{MOD}$ is unchanged.

Figure 6:
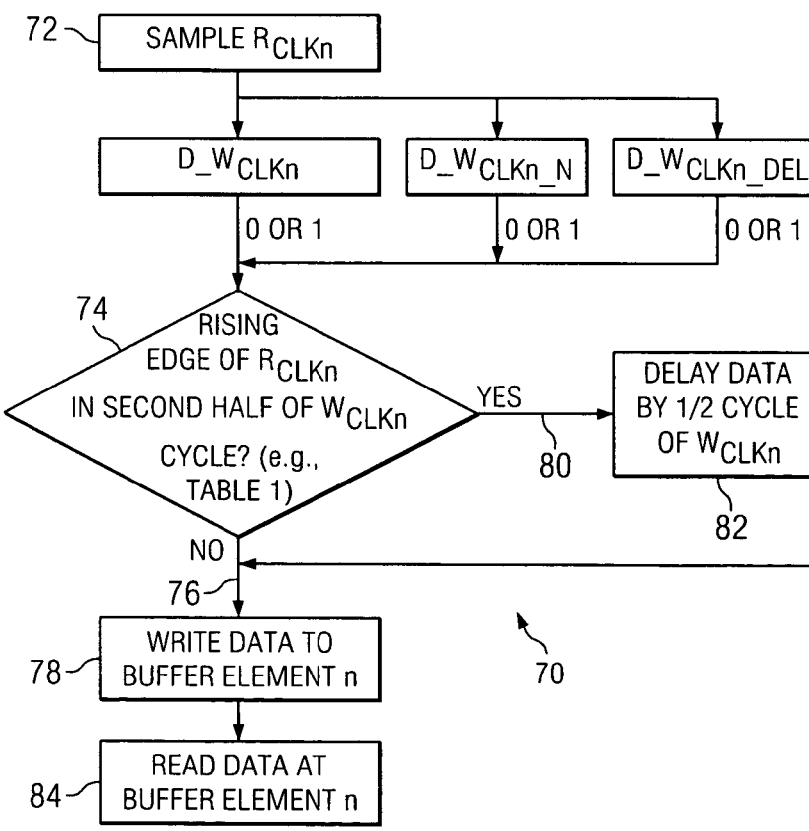
FIG. 6 is a process flow diagram providing an alternative view of exemplary embodiments of the methods of the invention.

A diagram providing an alternative view of an example of the process flow 70 of steps in a preferred embodiment of the invention is shown in FIG. 6. The write clock signal $W_{CLKn}$, its inverse $W_{CLKn\_N}$, and a delayed write clock signal $W_{CLKn\_DEL}$ are used to sample the read clock signal $R_{CLKn}$ as shown at step 72. The results are used to identify those instances when the rising edge of the read clock signal $R_{CLKn}$ corresponds with the second half of the write clock signal $W_{CLKn}$, as shown at decision diamond 74. For those instances in which the rising edge of the read clock signal $R_{CLKn}$ does not coincide with the second half of the write clock signal $W_{CLKn}$, i.e. the leading edge of the read clock signal $R_{CLKn}$, occurs during the first half of the write clock signal second $W_{CLKn}$, as shown by arrow path 76, the data is written to the FIFO element without delay 78. For those instances where the rising edge of the read clock signal $R_{CLKn}$ does occur during the second half of the write clock signal second $W_{CLKn}$, as shown by arrow path 80, the data is written to the FIFO element 78 after a one-half cycle delay 82. Subsequently, the data may be read from the FIFO element 84 in the usual manner, with reduced skew.

As indicated, the methods and devices of the invention provide advantages including but not limited to a decrease in latency resulting in increased data throughput speed and reduced costs. While the invention has been described with reference to certain illustrative embodiments, the methods and apparatus described are not intended to be construed in a limited sense. Various modifications and combinations of the illustrative embodiments as well as other advantages and embodiments of the invention will be apparent to persons skilled in the art upon reference to the description and claims.

We claim:

1. A method for reading and writing data in a system comprising two or more FIFO buffers, each buffer further comprising a write clock signal and a read clock signal having the same frequency but independent of phase, the method comprising the steps of:
   for each buffer, providing an inverted write clock signal;
   for each buffer, sampling the read clock signal using the write clock signal and the inverted write clock signal; thereby
   determining whether the rising edge of the read clock signal coincides with the first half or second half of the write clock signal; and
   upon a determination that the read clock signal coincides with the second half of the write clock signal, delaying for one half of a write clock cycle, then writing data to the buffer, whereby data skew in the system is reduced.

2. A method according to claim 1 further comprising the steps of:
   for each buffer, providing a delayed write clock signal;
   for each buffer, sampling the read clock signal using the delayed write clock signal; and
   using the sampled read clock signal, determining whether the rising edge of the read clock signal coincides with the first half or second half of the write clock signal.

3. A method according to claim 2 wherein providing the delayed write clock signal further comprises a step of introducing a one-half cycle delay.

4. A method according to claim 1 further comprising the steps of:
   for each buffer, providing a reset signal to reset the buffer synchronized to the rising edge of the write clock;
   resetting the buffer upon a determination that the read clock signal coincides with the first half of the write clock signal.

5. A method according to claim 1 further comprising the steps of:
   for each buffer, providing a reset signal to reset the buffer synchronized to the falling edge of the write clock;
   resetting the buffer upon a determination that the read clock signal coincides with the second half of the write clock signal.

6. A system for passing data through a plurality of asynchronous FIFO buffer elements, the system comprising:
   means for providing each buffer with a write clock signal;
   means for writing data to each buffer;
   means for providing each buffer with a read clock signal;
   means for reading data from each buffer;
   means for determining whether the rising edge of the read clock signal coincides with the second half of the write clock signal; and
   means for delaying for one half of a write clock cycle, then writing data to the buffer, responsive to a determination that the read clock signal coincides with the second half of the write clock signal, whereby data skew in the system is reduced.

7. A system according to claim 6 wherein the means for determining whether the rising edge of the read clock signal coincides with the second half of the write clock signal further comprises:
   means for providing each buffer with an inverted write clock signal.

8. A system according to claim 6 wherein the means for determining whether the rising edge of the read clock signal coincides with the second half of the write clock signal further comprises:

means for providing each buffer with a delayed write clock signal.

9. A system according to claim 6 wherein the means for determining whether the rising edge of the read clock signal coincides with the second half of the write clock signal further comprises:
   means for providing each buffer with a delayed write clock signal by means of introducing a one quarter cycle delay.

10. A system according to claim 6 further comprising means for providing a reset signal to reset each buffer synchronized to the rising edge of the write clock signal.

11. A system according to claim 6 further comprising means for providing a reset signal to reset each buffer synchronized to the falling edge of the write clock signal.

* * * * *